United States Patent
Dishongh et al.

(10) Patent No.: US 7,652,372 B2
(45) Date of Patent: Jan. 26, 2010

(54) MICROFLUIDIC COOLING OF INTEGRATED CIRCUITS

(75) Inventors: Terry J. Dishongh, Portland, OR (US); Jason T. Cassezza, Beaverton, OR (US); Kevin S. Rhodes, Lynnwood, WA (US)

(73) Assignee: Intel Corporation, Santa Clara, CA (US)

( * ) Notice: Subject to any disclaimer, the term of this patent is extended or adjusted under 35 U.S.C. 154(b) by 861 days.

(21) Appl. No.: 11/103,216

(22) Filed: Apr. 11, 2005

(65) Prior Publication Data

US 2006/0227512 A1    Oct. 12, 2006

(51) Int. Cl.
*H01L 23/34* (2006.01)
*H01L 23/10* (2006.01)

(52) U.S. Cl. .................. 257/714; 257/713; 257/715; 257/707; 257/E23.098

(58) Field of Classification Search ......... 257/713–715, 257/707, E23.098; 137/828
See application file for complete search history.

(56) References Cited

U.S. PATENT DOCUMENTS

| | | | |
|---|---|---|---|
| 4,022,240 A * | 5/1977 | Marshall et al. ............. 137/209 |
| 4,989,070 A * | 1/1991 | Iversen et al. ............... 257/712 |
| 5,316,077 A | 5/1994 | Reichard |
| 5,535,818 A | 7/1996 | Fujisaki et al. |
| 6,227,809 B1 * | 5/2001 | Forster et al. ................. 417/53 |
| 6,898,273 B2 * | 5/2005 | Ernstrom et al. ....... 379/202.01 |
| 6,942,018 B2 * | 9/2005 | Goodson et al. ........... 165/80.4 |
| 2002/0103412 A1 * | 8/2002 | Trimmer ..................... 600/16 |
| 2002/0187501 A1 * | 12/2002 | Huang et al. .................. 435/6 |
| 2003/0057391 A1 * | 3/2003 | Krulevitch et al. ............ 251/11 |
| 2003/0164231 A1 | 9/2003 | Goodson et al. |
| 2003/0214783 A1 | 11/2003 | Narakino et al. |
| 2004/0007275 A1 * | 1/2004 | Hui Liu et al. .............. 137/828 |
| 2004/0151629 A1 * | 8/2004 | Pease et al. ................ 422/68.1 |
| 2006/0278288 A1 * | 12/2006 | Gilbert et al. ............... 137/827 |

FOREIGN PATENT DOCUMENTS

JP    2004289049    10/2004

OTHER PUBLICATIONS

U.S. Appl. No. 11/153,788, filed Jun. 15, 2005, Terry J. Dishongh et al.., *Controlling Biological Fluids in Microelectromechanical Machines*.

* cited by examiner

*Primary Examiner*—Nitin Parekh
(74) *Attorney, Agent, or Firm*—Trop, Pruner & Hu, P.C.

(57) ABSTRACT

A microchannel cooling system used to cool integrated circuits may include a number of microchannels which may be subject to bubble blockage. When bubble formation or nucleation occurs due to heating, the bubbles may become trapped within the microchannels. A valve within the microchannel may automatically operate, at least partially, to close off the microchannel, allowing the bubble to be freed and to be flushed from the channel in some embodiments.

15 Claims, 4 Drawing Sheets

MICROFLUIDIC COOLING OF INTEGRATED CIRCUITS

BACKGROUND

This invention relates generally to cooling integrated circuits.

During operation, integrated circuits, such as microprocessors, develop considerable heat. This heat adversely affects the performance of the device. As a result, a variety of cooling techniques are known for cooling integrated circuits.

Microchannels are channels that may be microfabricated during a semiconductor fabrication process. The microchannels may be U-shaped and may be etched into silicon. These microchannels may be generally parallel and each may be less than one hundred microns in width. If the array of microchannels is situated directly atop the heat generating integrated circuit, the circulation of fluid through those microchannels may be effective to cool the integrated circuit.

One problem with such microchannels is that, during heating, bubbles may form in the microchannels. These bubbles may effectively block the flow of fluid through the microchannel. As a result, if enough microchannels become bubble blocked, the integrated circuit is no longer effectively cooled. This is because there is no longer sufficient cooling flow to transfer heat away from the integrated circuit.

Thus, there is a need for better ways to provide microfluidic cooling of integrated circuits.

DETAILED DESCRIPTION

Figure 1:
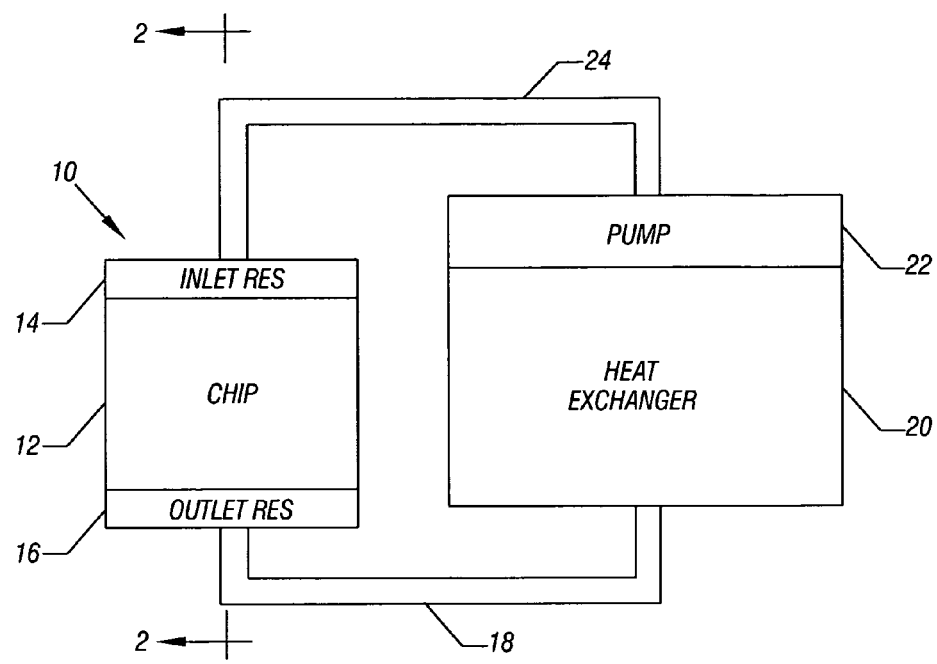
FIG. 1 is a schematic depiction of one embodiment of the present invention.

Referring to FIG. 1, a microfluidic cooling assembly may be adapted to cool an integrated circuit 12 which, for example, may be any heat generating integrated circuit including a microprocessor. Associated with the integrated circuit 12 are an inlet reservoir 14 and an outlet reservoir 16. Fluid flow channels 24 and 18 provide fluid from an external pump 22 and an external heat exchanger 20. However, it may be possible to incorporate the pump 22 into the integrated circuit 12 in some embodiments. The heat exchanger 20 may be any conventional heat exchanger, including an air cooled heat exchanger.

A cooling fluid, such as ionized water, may pass from the pump 22, through the passage 24, and into the inlet reservoir 14. From there, the cooling fluid passes through a plurality of microchannels 28 which extend in the fluid flow direction across the upper surface of the chip 12 into the outlet reservoir 16. From the outlet reservoir, the cooling fluid passes through the passage 18 to the heat exchanger 20 where the cooling fluid gives off heat. Thereafter, the cooling fluid is again pumped through the system.

Figure 2:
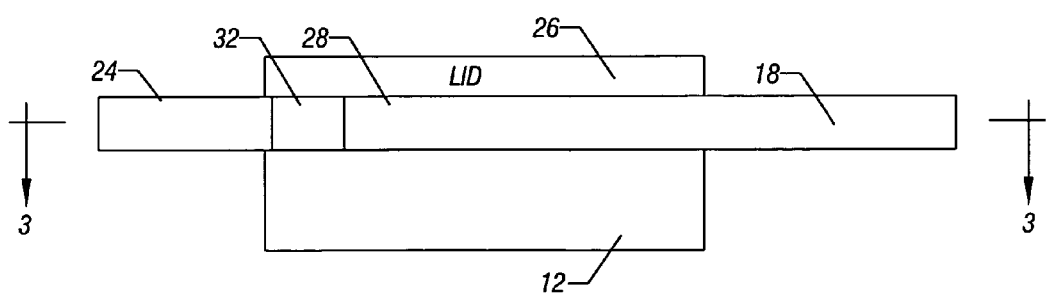
FIG. 2 is an enlarged, schematic cross-sectional view taken generally along the line 2-2 in FIG. 1.

Referring to FIG. 2, microchannels 28 extend above the integrated circuit chip 12. Thus, the microchannels 28 extend in the fluid flow direction and, in some embodiments, may have a U-shaped internal configuration. A flap valve 32 may be secured to a microchannel sidewall. The valve 32 can be deflected outwardly from the sidewall to close off the microchannel 28. In some embodiments, the valve 32 may be of a bimetal strip so that it may be heat activated to move into the fluid flow passage and obstruct the same. Over the open topped microchannels 18 may be a lid 26. Under the microchannel 28 may be the chip 12.

Figure 3:
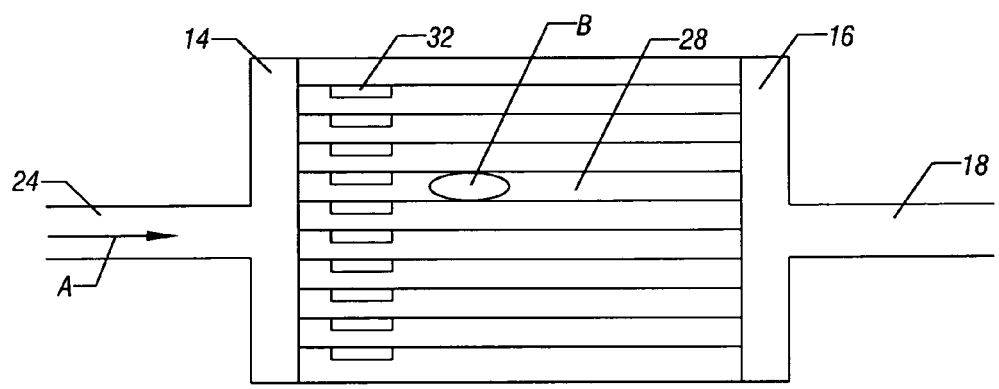
FIG. 3 is a horizontal cross-sectional view taken generally along the line 3-3 in FIG. 2 in a first valve configuration.

Referring to FIG. 3, in accordance with one embodiment of the present invention, a number of microchannels 28 may extend in parallel across the upper surface of the chip 12 (FIG. 2) in the fluid flow direction, indicated by the arrow A. Each of the microchannels 28 communicates with the inlet reservoir 14 and the outlet reservoir 16. Thus, fluid flow from the channel 24 passes into the inlet reservoir 14 and is distributed among the microchannels 28. The fluid flow passes through the microchannels 28, receiving heat from the underlying integrated circuit 12. The fluid then is collected in the outlet reservoir 16 and passed by the channel 18 back to the heat exchanger 20 for heat exchange.

As shown in FIG. 3, in one embodiment, each of the microchannels 28 may include a flap valve 32 secured on one sidewall. In some embodiments, the valve 32 may be formed by microelectromechanical system techniques including semiconductor microfabrication. The valves 32 may be provided on the inlet side of the microchannels 28.

As shown in FIG. 3, a bubble B has formed in one of the microchannels 28, just downstream of its associated valve 32. Such a bubble obstructs the flow of fluid and prevents effective cooling in some cases. The bubble may become lodged because the meniscus force on the upstream side of the bubble prevents the bubble from being flushed out. Thus, reduced fluid flow occurs downstream of the bubble B, resulting in excessive heating in the area of the bubble and downstream therefrom.

Figure 4:
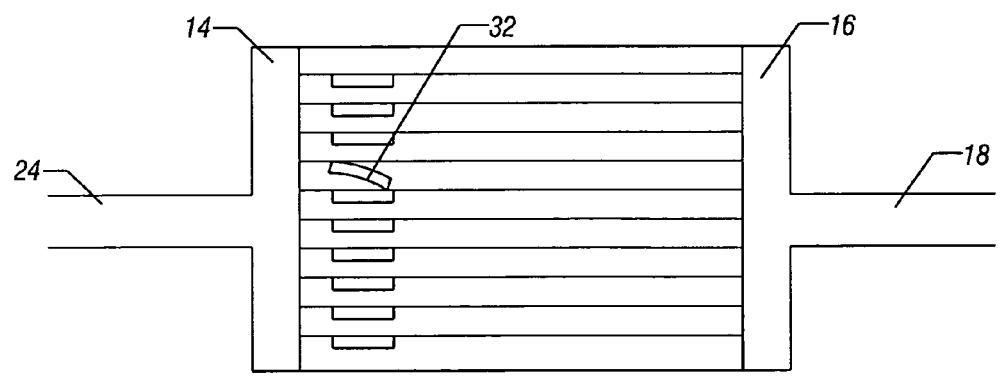
FIG. 4 is a cross-sectional view corresponding to FIG. 3 but with a valve operated in accordance with one embodiment of the present invention.

Referring to FIG. 4, in response to the generation of heat, the bimetal valve 32, secured to the microchannel 28 wall on its upstream extent, swings from its downstream free end outwardly into the microchannel and across the microchannel 28 to at least partially close off the flow on the upstream side of the bubble B. As a result of the reduction of the microchannel effective flow cross-section, the meniscus on the upstream side of the bubble B may be broken, allowing the bubble to pass outwardly. In particular, by removing the fluid from the upstream side of the bubble B, the meniscus is broken and, without surface tension, the bubble no longer can stick within the microchannel 28. As a result, the bubble is flushed out and dissipated in the outlet reservoir 16 and/or ensuing components.

The blockage of fluid flow may result in heating of the bimetal valve 32, resulting in its operation exactly when needed because of bubble occlusion. Once the bubble flushes out, and the passage 28 is no longer occluded, the flow of fluid and the pressure supplied by the pump 22 pushes the valve 32 back to the open position and further cools the bimetal valve 32 so that it returns to the position shown in FIG. 3.

While in some embodiments, a valve 32 may be associated with every fluid passage 28, it is also contemplated that the valves 32 may be only associated with groups of microchannels 28. For example, such groups may radiated from a common passage that includes the valve. This would reduce the number of valves that need to be fabricated.

Figure 5:
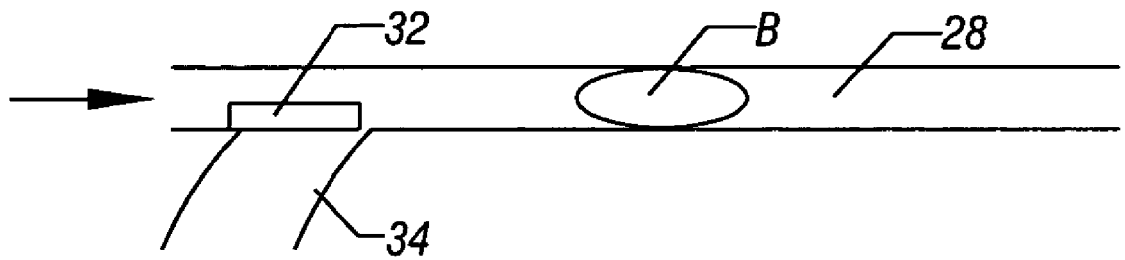
FIG. 5 is an enlarged, cross-sectional view of another embodiment of the present invention in a first configuration.
Figure 6:
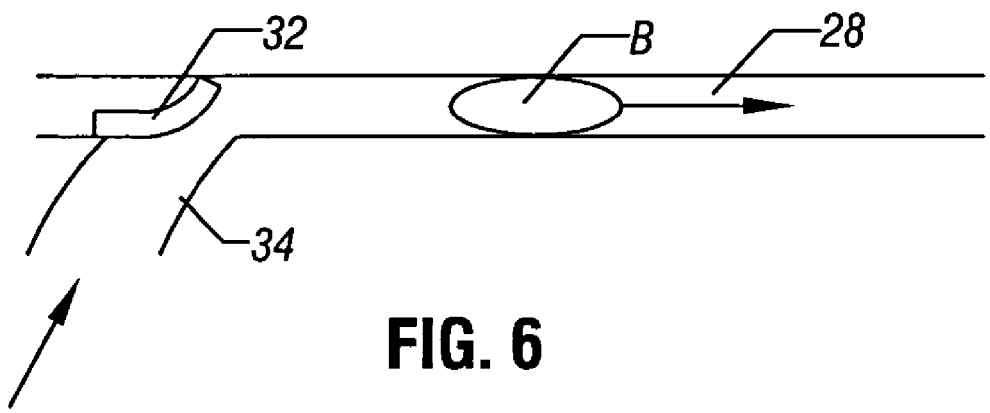
FIG. 6 is an enlarged, cross-sectional view of the embodiment shown in FIG. 5 in a second configuration.

Referring to FIGS. 5 and 6, in accordance with another embodiment, instead of providing a microchannel 28 with only a single flow passage, a valve 32 and an alternate flow passage 34 may be provided. However, other arrangements of the channels 28 and 34 may be provided.

In the illustrated embodiment, the microchannel 28 is straight and the flow passage 34 merges into the microchannel 28. However, other arrangements of the microchannels 28 and 34 may be provided. In this case, the communication between the channel 34 and the microchannel 28 is controlled by the bimetal valve 32. When fluid flow, indicated by the arrow in FIG. 5, is occluded by a bubble B, the valve 32 operates as before, allowing fluid flow from the channel 34 into the channel 28 to flush out the bubble 28. In some embodiments, the channel 34 communicates with the same inlet reservoir 14 that supplies the fluid to the microchannel 28. Again, the occlusion of flow may release the meniscus and allows bubble expansion. Then, the flow from the passage 34 can operate to flush out, because of increased fluid pressure, the bubble B. Thus, as shown in FIG. 6, with the closing the microchannel 28, flow can come in from the alternate passage 34, flushing out the bubble B.

Figure 7:
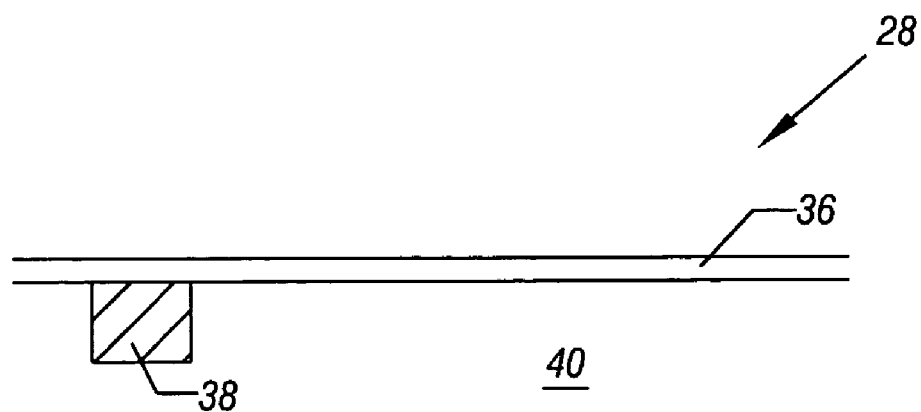
FIG. 7 is a greatly enlarged, cross-sectional view of the embodiment shown in FIGS. 5 and 6 at an early stage of manufacture in accordance with one embodiment of the present invention.
Figure 8:
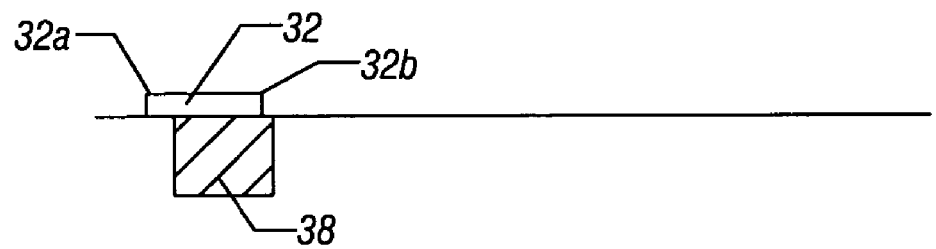
FIG. 8 is a greatly enlarged, cross-sectional view of the embodiment shown in FIG. 7 at a subsequent stage of manufacture.
Figure 9:
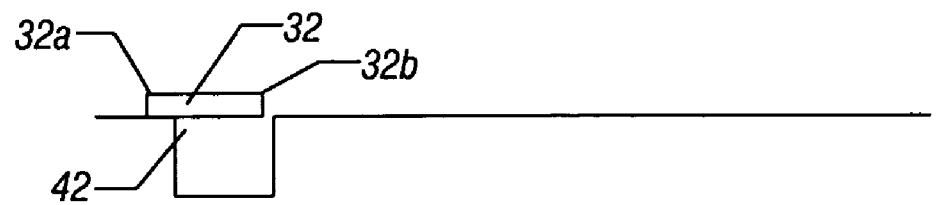
FIG. 9 is a greatly enlarged, cross-sectional view of the embodiment shown in FIG. 8 at a later stage of fabrication in accordance with one embodiment of the present invention.

Referring to FIGS. 7-9, one exemplary process for microfabricating the valves 32 within the microchannels 28 is illustrated. In this embodiment, a substrate 40 may have a pore 38 filled with a material which may be removed by thermal decomposition. Over the substrate 40 and the pore 38 may be applied the bimetal valve material 36. The bimetal valve material 36, which ultimately forms a valve 32, may be formed by successively depositing two metal layers to make up the bimetal valve. The two metals are chosen to have different coefficients of thermal expansion. As a result, the valve 32 tries to coil when heated.

Thereafter, the layer 36 may be patterned to form the valve 32. As indicated, the valve 32 is situated with its attached end 32a over the substrate 40 and its unattached end 32b over the pore 38.

When the material 38 in the pore is thermally decomposed, a cavity 42 is formed under the valve 32, simultaneously freeing the free end 32b of the valve, while maintaining the fixation of the attached end 32a to the microchannel 28.

Without being limited to theory, it is believed that as the gas bubbles formed in the microchannels attempt to expand they create a vacuum on the upstream side. When the valve is closed due to heating of the valve, that vacuum may be broken as well as the meniscus. When the valve becomes cool, it again reopens, aiding in flushing out the bubble. Once the bubble is freed of the suction on the upstream end, it can expand and push itself out in many cases.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:
   a semiconductor integrated circuit chip; and
   a plurality of microchannels formed over said chip, said microchannels including a valve operable to remove a bubble formed in a microchannel at a location spaced away from said valve.

2. The circuit of claim 1 wherein said valve to automatically occlude the flow of fluid through said microchannel when a bubble is formed.

3. The circuit of claim 1 wherein said valve is heat activated.

4. The circuit of claim 1 wherein said valve is a bimetal valve.

5. The circuit of claim 1 wherein said valve is a microfabricated valve.

6. The circuit of claim 1 including a passage to communicate with the microchannel when a bubble forms.

7. The circuit of claim 6 wherein said valve to provide selective communication between said passage and said microchannel when a bubble forms.

8. The circuit of claim 1 wherein said valve to automatically occlude flow through said microchannel when a bubble forms and to automatically provide unrestricted fluid flow after the bubble is removed.

9. The circuit of claim 1 wherein said microchannel is U-shaped having a bottom and sidewalls, said valve being formed in one of said sidewalls.

10. The circuit of claim 1 wherein said valve bends when heated.

11. A cooling device comprising:
    a plurality of microchannels; and
    a valve in one of said microchannels to remove a bubble formed in a microchannel at a location spaced away from said valve.

12. The device of claim 11 wherein said valve to automatically occlude the flow of fluid through said microchannel when a bubble is formed.

13. The device of claim 11 wherein said valve is heat activated.

14. The device of claim 11 wherein said valve is a bimetal valve.

15. The device of claim 11 wherein said valve is a microfabricated valve.

* * * * *